United States Patent
Cocchini et al.

(10) Patent No.: US 11,050,172 B2
(45) Date of Patent: Jun. 29, 2021

(54) INSERTABLE STUBLESS INTERCONNECT

(71) Applicant: International Business Machines Corporation, Armonk, NY (US)

(72) Inventors: Matteo Cocchini, Long Island City, NY (US); Michael Cracraft, Poughkeepsie, NY (US); Zachary Thomas Dreiss, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/692,426

(22) Filed: Nov. 22, 2019

(65) Prior Publication Data

US 2021/0159622 A1 May 27, 2021

(51) Int. Cl.
*H01R 12/70* (2011.01)
*H05K 1/02* (2006.01)
*H01R 43/26* (2006.01)

(52) U.S. Cl.
CPC ..... *H01R 12/7082* (2013.01); *H01R 12/7011* (2013.01); *H01R 43/26* (2013.01); *H05K 1/0292* (2013.01)

(58) Field of Classification Search
CPC ........... H01R 12/7011; H01R 12/7082; H01R 43/26; H01R 9/2666; H01R 2201/20; H05K 1/0292; H05K 1/0295
USPC ......................................................... 439/66
See application file for complete search history.

(56) References Cited

U.S. PATENT DOCUMENTS

| | | | |
|---|---|---|---|
| 3,573,670 A * | 4/1971 | Skobern | H05K 1/0253 333/33 |
| 5,065,283 A | 11/1991 | Adachi | |
| 5,645,433 A | 7/1997 | Johnson | |
| 6,388,208 B1 * | 5/2002 | Kiani | H05K 1/0222 174/260 |
| 6,621,012 B2 | 9/2003 | Crockett | |
| 7,096,555 B2 | 8/2006 | Tourne | |
| 7,337,537 B1 | 3/2008 | Smetana, Jr. | |
| 7,767,913 B2 * | 8/2010 | Corisis | H05K 1/18 174/262 |
| 8,198,547 B2 | 6/2012 | Hardin | |
| 8,528,203 B2 | 9/2013 | Balcome | |
| 9,872,398 B1 | 1/2018 | Doyle | |
| 10,212,828 B1 | 2/2019 | Kuczynski | |
| 2004/0251047 A1 * | 12/2004 | Bartley | H05K 3/429 174/262 |

(Continued)

OTHER PUBLICATIONS

Anonymous, "Two Photon Resist Process to Fabricate Stubless Vias," IP.com, Disclosure No. IPCOM000216369D, Apr. 2, 2012, 3 pages.

(Continued)

*Primary Examiner* — Oscar C Jimenez
(74) *Attorney, Agent, or Firm* — Grant M. McNeilly

(57) ABSTRACT

A multi-layer circuit board includes a first layer including a first trace, a second layer connected to the first layer and including a second trace, and a stubless interconnect positioned through the first layer and the second layer. The stubless interconnect includes a body that is electrically insulative, and a bridge trace that is electrically conductive and connected to the body, the bridge trace extending from the first trace to the second trace to electrically connect the first trace and the second trace.

15 Claims, 9 Drawing Sheets

(56) References Cited

U.S. PATENT DOCUMENTS

| | | |
|---|---|---|
| 2007/0062730 A1 | 3/2007 | Murry |
| 2007/0246252 A1 | 10/2007 | Buchwalter |
| 2008/0202799 A1 | 8/2008 | Graydon |
| 2008/0301934 A1 | 12/2008 | Dudnikov, Jr. |
| 2009/0188710 A1 | 7/2009 | Senk |
| 2011/0017505 A1 | 1/2011 | Hardin |
| 2011/0017507 A1* | 1/2011 | Hardin ............... H05K 1/184 174/551 |
| 2012/0211273 A1 | 8/2012 | Kuczynski |
| 2015/0208514 A1 | 7/2015 | Thomas |
| 2016/0192506 A1 | 6/2016 | Thomson, Jr. |
| 2016/0278208 A1 | 9/2016 | Pen |
| 2019/0045629 A1 | 2/2019 | Doyle |

OTHER PUBLICATIONS

Connor et al., "Quasi-cylindrical, embedded, series capacitors for PCB strip line wiring applications", IBM Disclosure P201806736, Aug. 28, 2018, 2 pages.

O'Connell et al., "Method to Eliminate Backdrilling with Self Healing Board", IBM Disclosure for AUS82016003, Nov. 19, 2015, 4 pages.

Shan et al., "Realization of Ultra-Low Power I/O," 63rd Electronic Components and Technology Conference (ECTC), 2013, pp. 2218-2222.

* cited by examiner

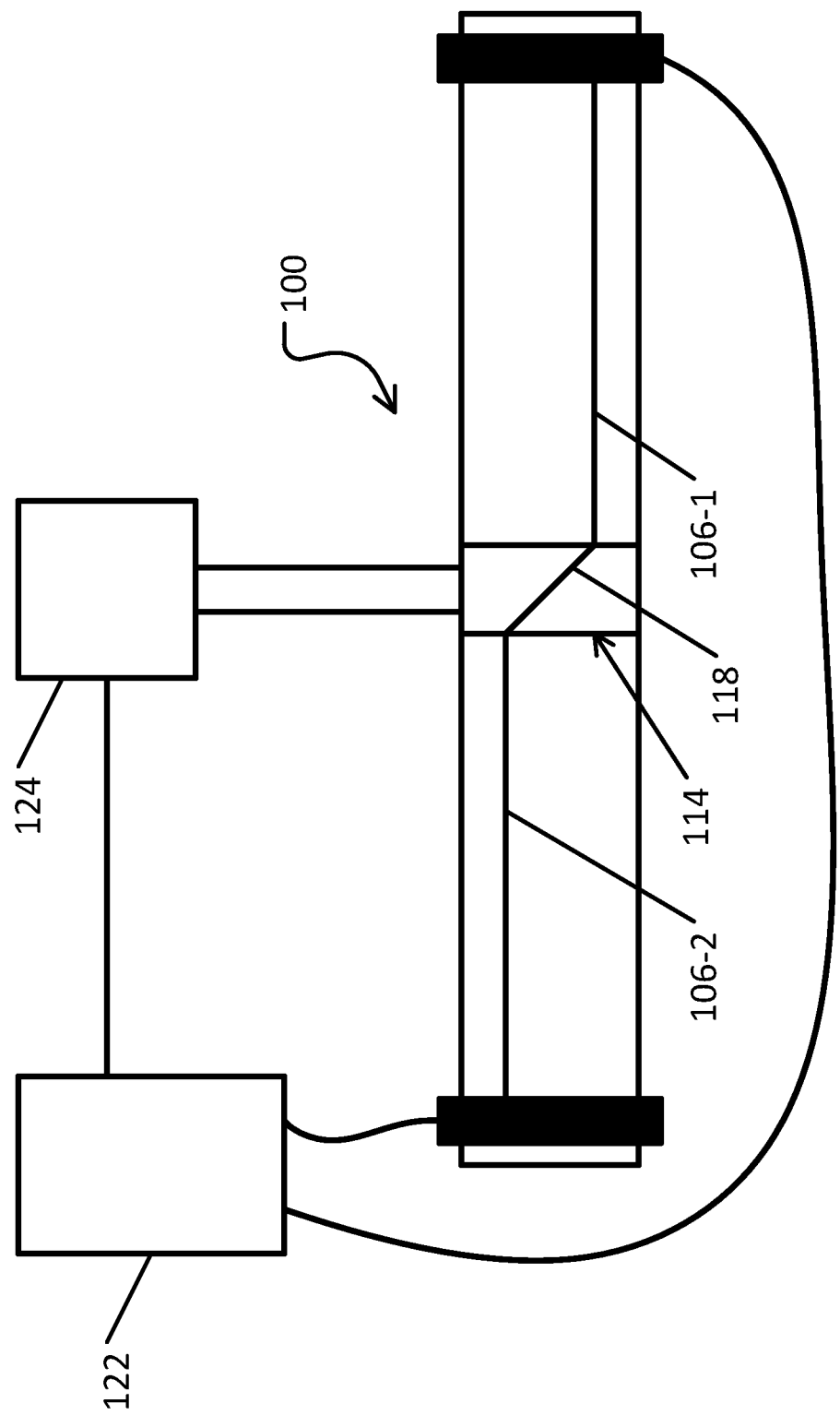

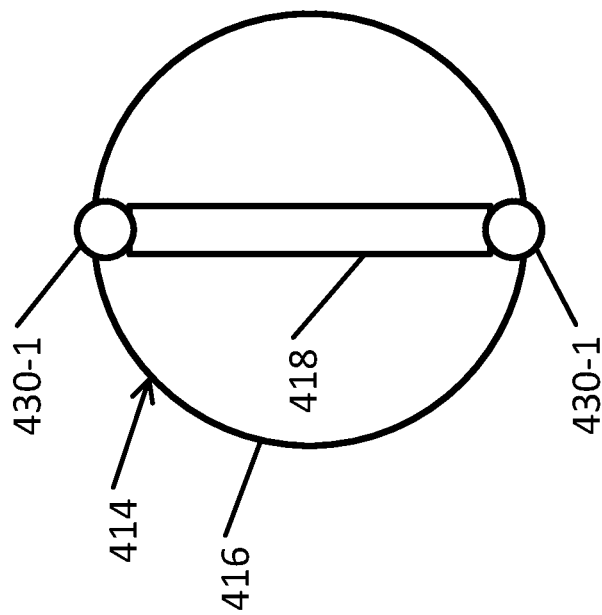
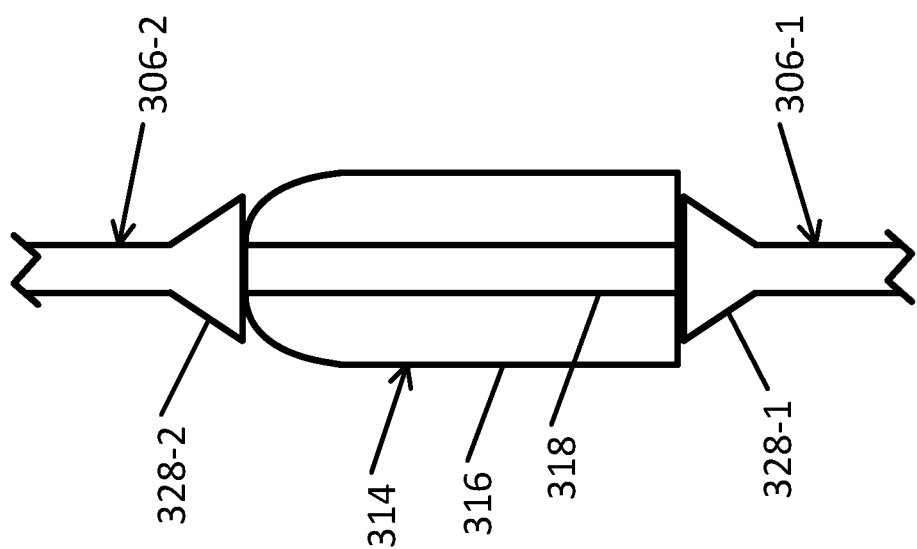

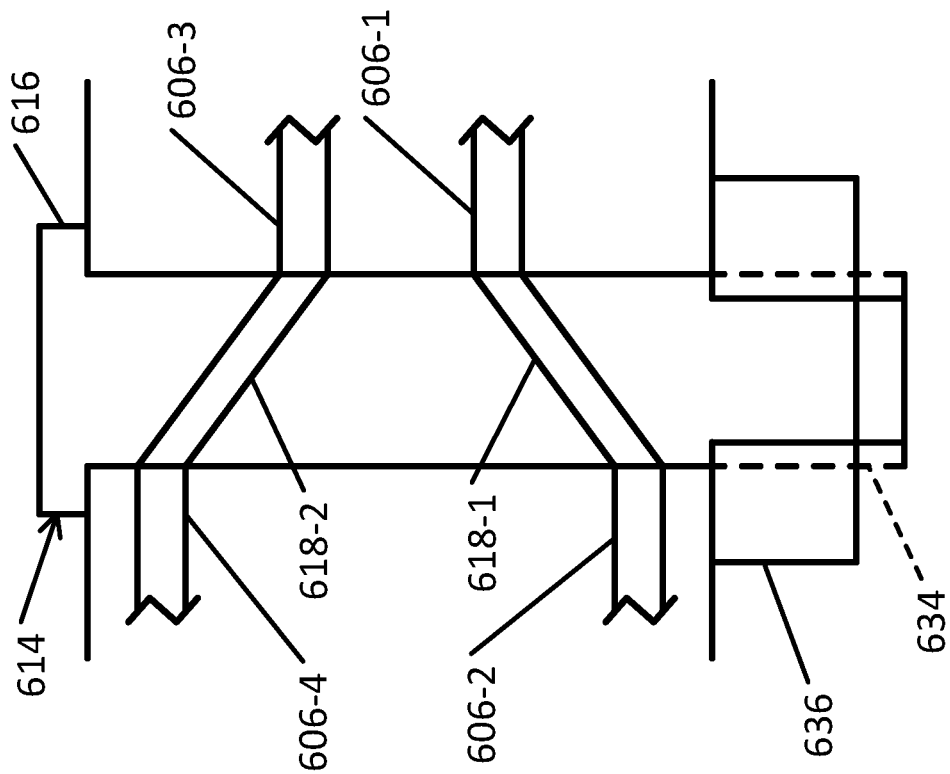
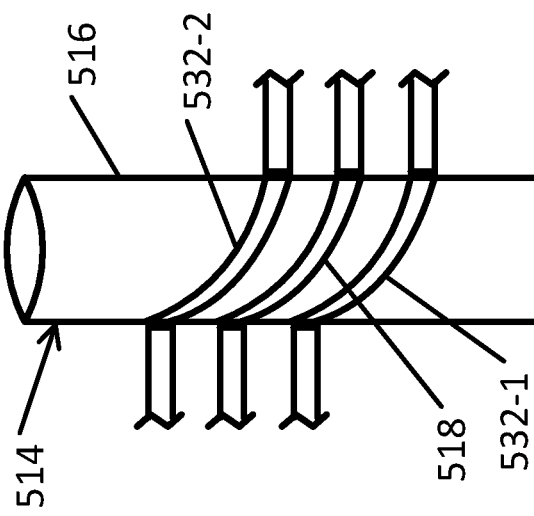

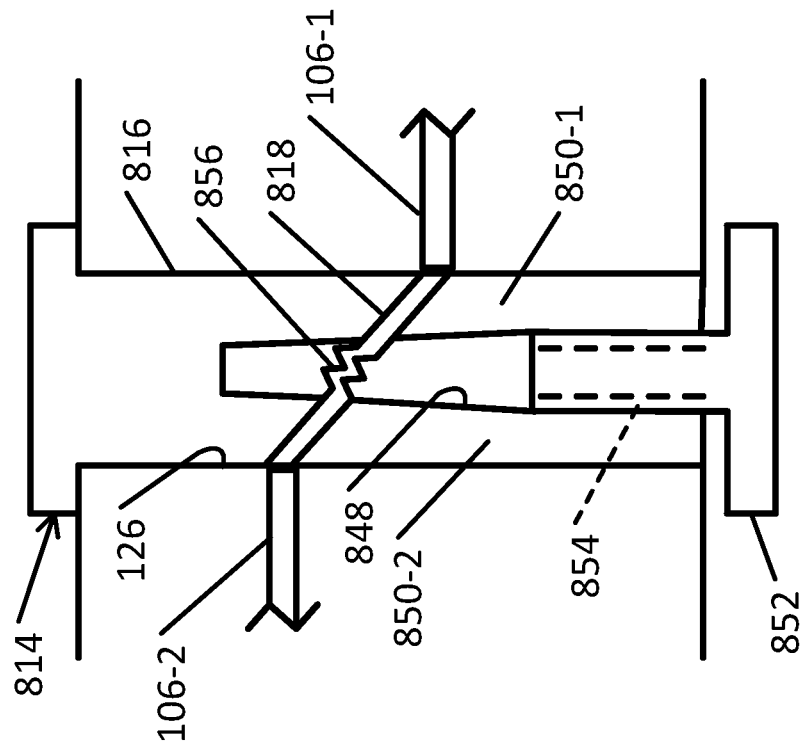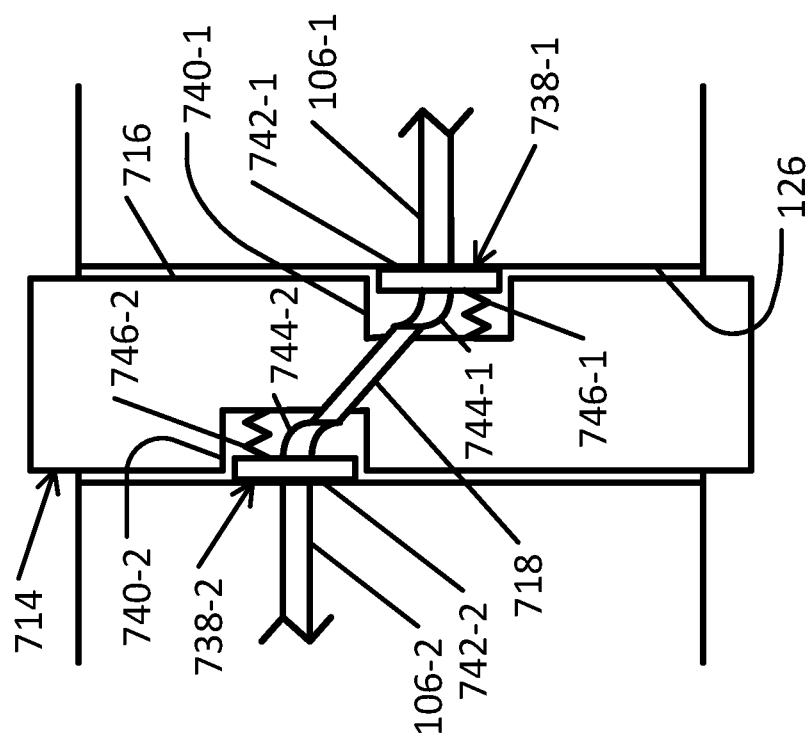

US 11,050,172 B2

INSERTABLE STUBLESS INTERCONNECT

BACKGROUND

The present invention relates to multi-layer circuit boards, and more specifically, to insertable stubless interconnects for multi-layer circuit boards.

Multi-layer circuit boards can be comprised of stacked printed circuit boards (PCBs) separated by electrically insulating (e.g., dielectric) bonding layers. Sometimes, an electrical connection is made between two different PCB layers. Some of such electrical connections are used for high-speed signal transmission. Such high-speed signals can be sensitive to unwanted resonances and reflections along the communication channel, which can be caused by the geometry of the electrical conductor in the multi-layer circuit board.

SUMMARY

According to an embodiment of the present invention, a multi-layer circuit board includes a first layer including a first trace, a second layer connected to the first layer and including a second trace, and a stubless interconnect positioned through the first layer and the second layer. The stubless interconnect includes a body that is electrically insulative, and a bridge trace that is electrically conductive and connected to the body, the bridge trace extending from the first trace to the second trace to electrically connect the first trace and the second trace.

According to an embodiment of the present invention, a method includes providing a multi-layer circuit board including a first layer including a first trace and a second layer connected to the first layer and including a second trace, cutting an aperture through the first layer and the second layer, and inserting a stubless interconnect into the aperture. The stubless interconnect includes a body that is electrically insulative, and a bridge trace that is electrically conductive and connected to the body, the bridge trace extending from the first trace to the second trace to electrically connect the first trace and the second trace.

According to an embodiment of the present invention, a stubless interconnect for a multi-layer circuit board includes a body that is electrically insulative and is configured to pass through a first layer and a second layer of the multi-layer circuit board, and a bridge trace that is electrically conductive and connected to the body. When the stubless interconnect is installed in the multi-layer circuit board, the bridge trace extends from the first layer to the second layer to electrically connect to a first trace in the first layer and a second trace in the second layer, and wherein a cross-sectional area of the bridge trace is no more than thrice a cross-sectional area of the first trace and/or a cross-sectional area of the second trace.

BRIEF DESCRIPTION OF THE DRAWINGS

FIG. 3B shows a schematic view of a multi-layer circuit board being assembled, wherein an insertable stubless interconnect has been properly inserted, according to an embodiment of the present disclosure.

FIG. 5A is a schematic top view of alternate embodiment traces, and plug, according to an embodiment of the present disclosure.

FIG. 5B is a schematic top view of alternate embodiment bridge trace, according to an embodiment of the present disclosure.

FIG. 6A is a perspective view of an alternate embodiment plug with traces, according to an embodiment of the present disclosure.

FIG. 6B is a cross-sectional view (from a perspective similar to that of FIG. 2) of an alternate embodiment plug with traces, according to an embodiment of the present disclosure.

FIG. 7A is a cross-sectional view (from a perspective similar to that of FIG. 2) of an alternate embodiment plug with traces, according to an embodiment of the present disclosure.

FIG. 7B is a cross-sectional view (from a perspective similar to that of FIG. 2) of an alternate embodiment plug with traces, according to an embodiment of the present disclosure.

DETAILED DESCRIPTION

Figure 1:
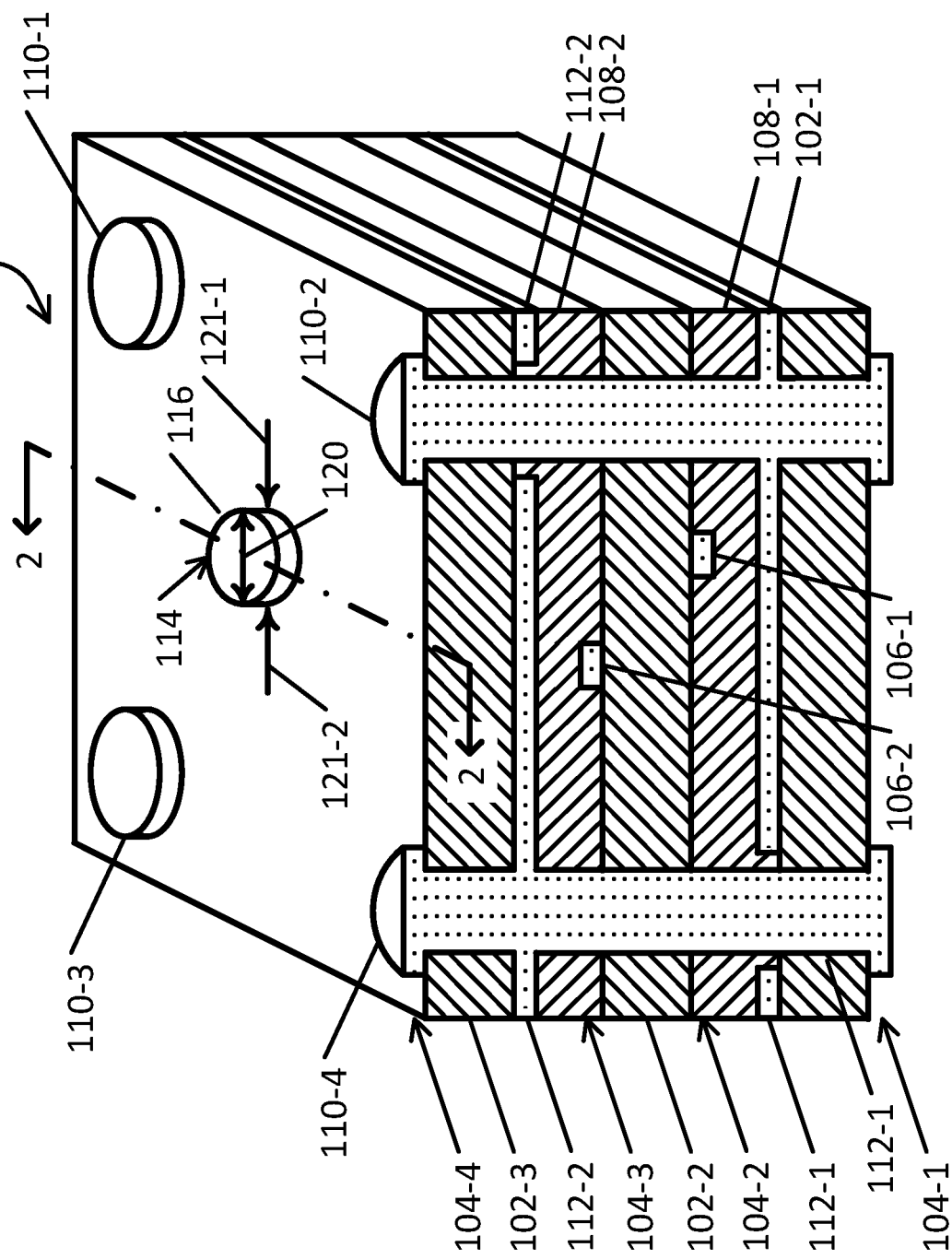
FIG. 1 is a cross-sectional view of a multi-layer circuit board as indicated along line 1-1 in FIG. 2, according to an embodiment of the present disclosure.
Figure 2:
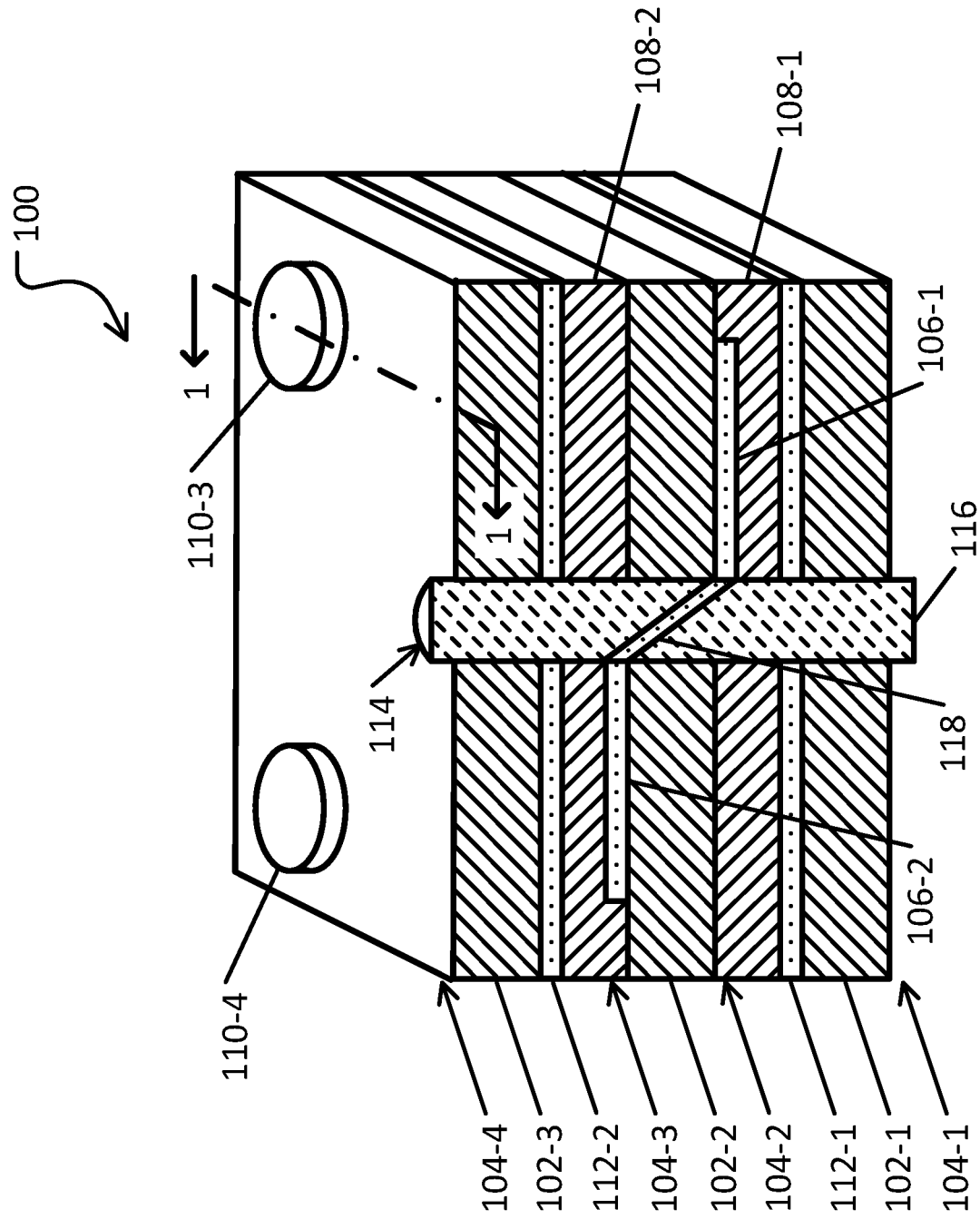
FIG. 2 is a cross-sectional view of the multi-layer circuit board as indicated along line 2-2 in FIG. 1, according to an embodiment of the present disclosure.

FIG. 1 is a cross-sectional view of multi-layer circuit board (MLCB) 100 as indicated along line 1-1 in FIG. 2. FIG. 2 is a cross-sectional view of multi-layer circuit board 100 as indicated along line 2-2 in FIG. 1. FIGS. 1 and 2 will now be discussed together in conjunction with one another. It should be noted that references to directions and relative locations in this description may be merely due to the depiction and orientation of the Figures and should not be interpreted in an unduly limiting manner. In addition, the Figures may not be drawn to scale, and some elements therein may be exaggerated for the sake of clarity.

In the illustrated embodiment, MLCB 100 comprises lower core 102-1, central core 102-2, and upper core 102-3 (collectively, "cores 102"), on which layers 104-1, 104-2, 104-3, and 104-4 (collectively, "layers 104") reside, respectively. Layers 104-2 and 104-3 include traces 106-1 and 106-2 (collectively, "traces 106"). Traces 106 are comprised of electrically conductive materials that connect various electronic components (not shown), such as transistors, diodes, integrated circuit chips, resistors, and capacitors. While layers 104-1 and 104-4 are empty in the depicted embodiment for the sake of simplicity, they too could include traces 106 and electronic components.

Positioned between cores 102-1/102-2 and 102-2/102-3 are sheets 108-1 and 108-2 (collectively, "sheets 108"), respectively. Sheets 108 are comprised of electrically insulative materials, such as a dielectric material like fiberglass impregnated with resin (which is commonly known as "prepreg"). MLCB 100 also includes pins 110-1, 110-2, 110-3, and 110-4 (collectively, "pins 110") that are electrically conductive ground vias and extend through the height of MLCB 100 (i.e., though cores 102, layers 104, and sheets 108). Pins 110-1/110-2 and pins 110-3/110-4 are connected to ground planes 112-1 and 112-2 (collectively, "ground planes 112"), respectively. Ground planes 112 provide electrical grounding for MLCB 110.

In the illustrated embodiment, MLCB 110 further includes plug 114. Plug 114 is an insertable stubless vertical interconnect that is positioned in aperture 116 that extends through the height of MLCB 100 (i.e., though cores 102, layers 104, and sheets 108), although in alternate embodiments, plug 114 does not extend through the entire height of MLCB 100. Plug 114 is comprised of an electrically insulative (e.g., dielectric) body 116 with an electrically conductive bridge trace 118, the lateral orientation of which is indicated by bridge indicator 120 (which can be, for example, a two-dimensional line or a three-dimensional slot). At its ends, bridge trace 118 is electrically connected to traces 106, the lateral locations of which are indicated by trace indicators 121-1 and 121-2, respectively. While the ends of traces 106 and/or bridge trace 118 may be enlarged (to ensure electrical connectivity, as will be discussed later), in general, bridge trace 118 is comprised of the same material with the same cross-sectional size and shape (e.g., rectangular) as traces 106.

In some embodiments, the majority of bridge trace 118 has a cross-sectional area that is from one-third to three times the cross-sectional area of the majority of trace 106-1 and/or 106-2. In some embodiments, the majority of bridge trace 118 has a cross-sectional area that is from one-half to two times the majority of cross-sectional area of the majority of trace 106-1 and/or 106-2. In some embodiments, the majority of bridge trace 118 has a cross-sectional area that is from two-thirds to one-and-one-half times the cross-sectional area of the majority of trace 106-1 and/or 106-2. In some embodiments, the majority of bridge trace 118 has a cross-sectional area that is from nine-tenths and one-and-one-tenth times the cross-sectional area of the majority of trace 106-1 and/or 106-2. In some embodiments, traces 106 and bridge trace 118 are 0.076 mm-0.18 mm (3.0 mils-7.0 mils) wide and 0.0025 mm-0.051 mm (0.1 mils-2.0 mils) thick. The diameter of body 116 will be 0.25 mm-2.0 mm (10 mils-80 mils). Therefore, the length of bridge trace 118 will be the square root of the sum of the squares of the diameter of body 116 and the height of the distance traces 106-1 and 106-2.

The components and configuration of MLCB 100 allow for trace 106-1 to be electrically connected to trace 106-2 despite these two traces 106 being on different layers 104. Furthermore, having bridge trace 118 being similar in size and shape as traces 106 avoids the resonances and reflections that can occur when using traditional designs that include larger electrically conductive structures to connect different layers. This can permit a larger bandwidth of signals to be employed in MLCB 100, including high speed communication (for example, from 1 GHz to 36 GHz), without certain frequency ranges having high noise effects.

Figure 3A:
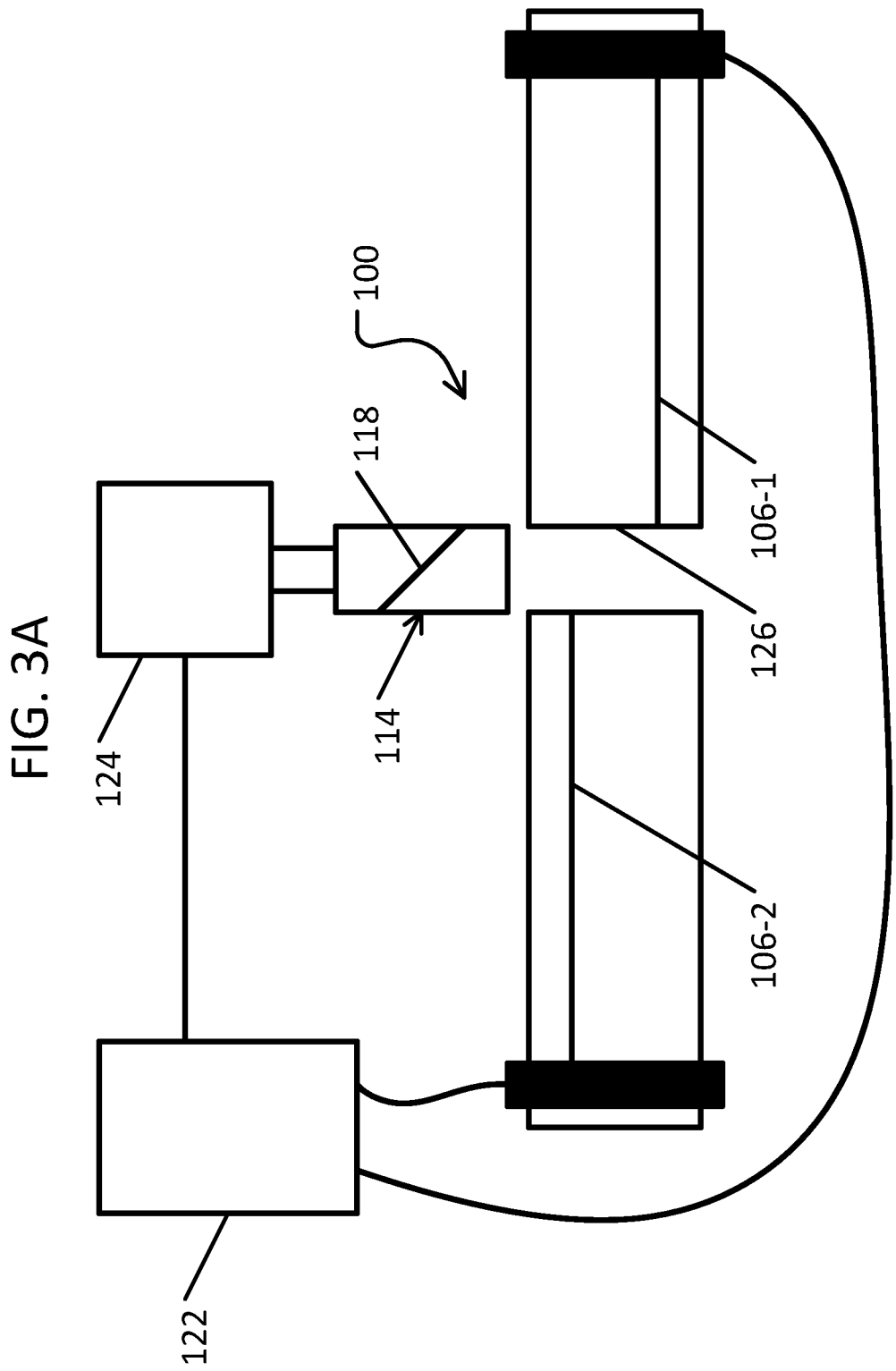
FIG. 3A shows a schematic view of a multi-layer circuit board being assembled, wherein an insertable stubless interconnect has not yet been inserted, according to an embodiment of the present disclosure.

FIG. 3A shows a schematic view of MLCB 100 being assembled, wherein plug 114 has not yet been inserted, according to an embodiment of the present disclosure. In the illustrated embodiment, electrical testing device 122 has been connected to traces 106. Electrical testing device 122 is configured to measure a quality of the connection (or lack thereof) between traces 106-1 and 106-2, such as impedance and/or waveform reflection. Therefore, electrical testing device 122 can be an LCR (impedance, capacitance, and resistance) meter and/or a time-domain reflectometer.

In the illustrated embodiment, assembler 124 is connected to plug 114 in preparation for insertion into MLCB 100. Assembler 124 can be an autonomous or human-controlled robot, a fixture, or another piece of manufacturing equipment that can be communicatively connected to electrical testing device 122. In alternate embodiments, assembler 124 can be a manufacturing technician who can see a display (not shown) of electrical testing device 122.

As depicted in FIG. 3A, electrical testing device 122 is detecting a lack of electrical connection between trace 106-1 and 106-2. This connection data can be communicated to assembler 124 in real-time, so that assembler 124 can move plug 114 into aperture 126 vertically and rotationally (using indicator 120, shown in FIG. 1). In alternate embodiments, electrical testing device 122 does not begin measuring until assembler 124 has inserted plug 114 into a nominal position in MLCB 100 (i.e., a position wherein bridge trace 118 should contact both traces 106, although this may not necessarily be the case due to, for example, tolerances of MLCB 100, tolerances of plug 114, and/or calibration or positioning errors of assembler 124).

FIG. 3B shows a schematic view of MLCB 100 being assembled, wherein plug 114 has been properly inserted by assembler 124, according to an embodiment of the present disclosure. As depicted in FIG. 3B, electrical testing device 122 is detecting a sufficient electrical connection between trace 106-1 and 106-2. Therefore, insertion of plug 114 has been completed, and the manufacturing process for MLCB 100 can move to the next step (not shown).

Figure 3C:
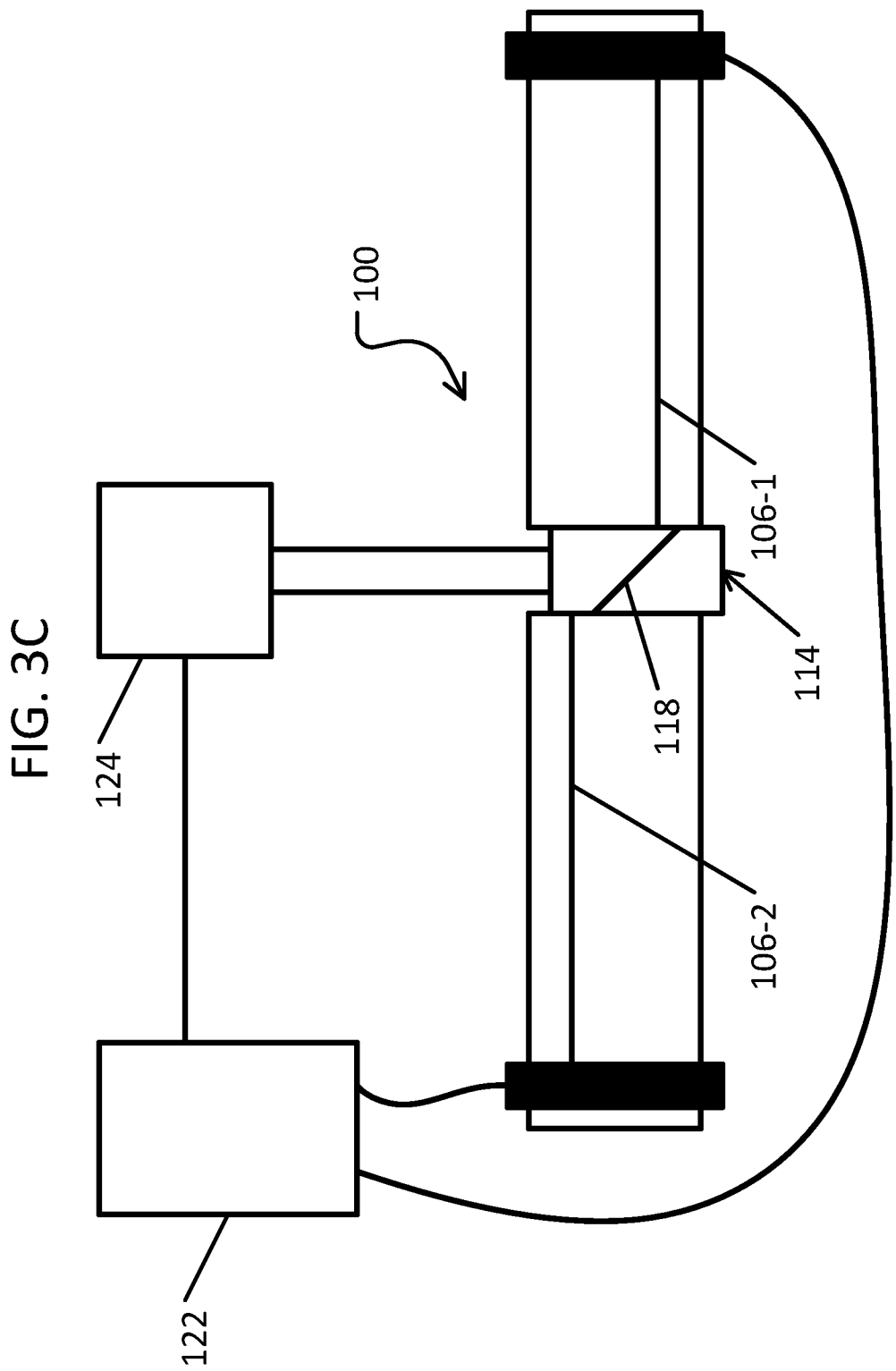
FIG. 3C shows a schematic view of a multi-layer circuit board being assembled, wherein an insertable stubless interconnect has been over-inserted, according to an embodiment of the present disclosure.

FIG. 3C shows a schematic view of MLCB 100 being assembled, wherein plug 114 has been over-inserted by assembler 124, according to an embodiment of the present disclosure. As depicted in FIG. 3C, electrical testing device 122 is detecting a poor electrical connection or lack thereof between trace 106-1 and 106-2. This connection data can be communicated to assembler 124, so that assembler 124 can reposition plug 114. If electrical testing device 122 had been operating during the insertion of plug 114, it may have recorded a spike in electrical connection quality. Assembler 124 can use this information to reposition plug 114 to where it was when the spike was recorded. If electrical testing device 122 had not been operating during the insertion of plug 114 or had not recorded a spike in electrical connection quality, then assembler 124 can follow a course of inserting, retracting, and rotating plug 114 to find a position where there is a sufficient electrical connection. If such a position is found (such as the position shown in FIG. 3B), then insertion of plug 114 has been completed, and the manufacturing process for MLCB 100 can move to the next step.

If the course has been completed without finding such a position, then plug 114 can be retracted for inspection and/or disposal, and another plug 114 (not shown) can be tried. If a predetermined number of different plugs 114 has been tried (for example, three) without success, then MLCB 100 can be taken out of line for inspection and/or disposal. Thereby, using electrical testing device 122 during the assembly of MLCB 100 creates a closed-loop feedback system that can ensure that plug 114 is properly inserted before MLCB 100 moves on to the next step of manufacturing. In addition, faulty plugs 114 and MLCBs 100 can be identified and taken out of the manufacturing line.

Figure 4:
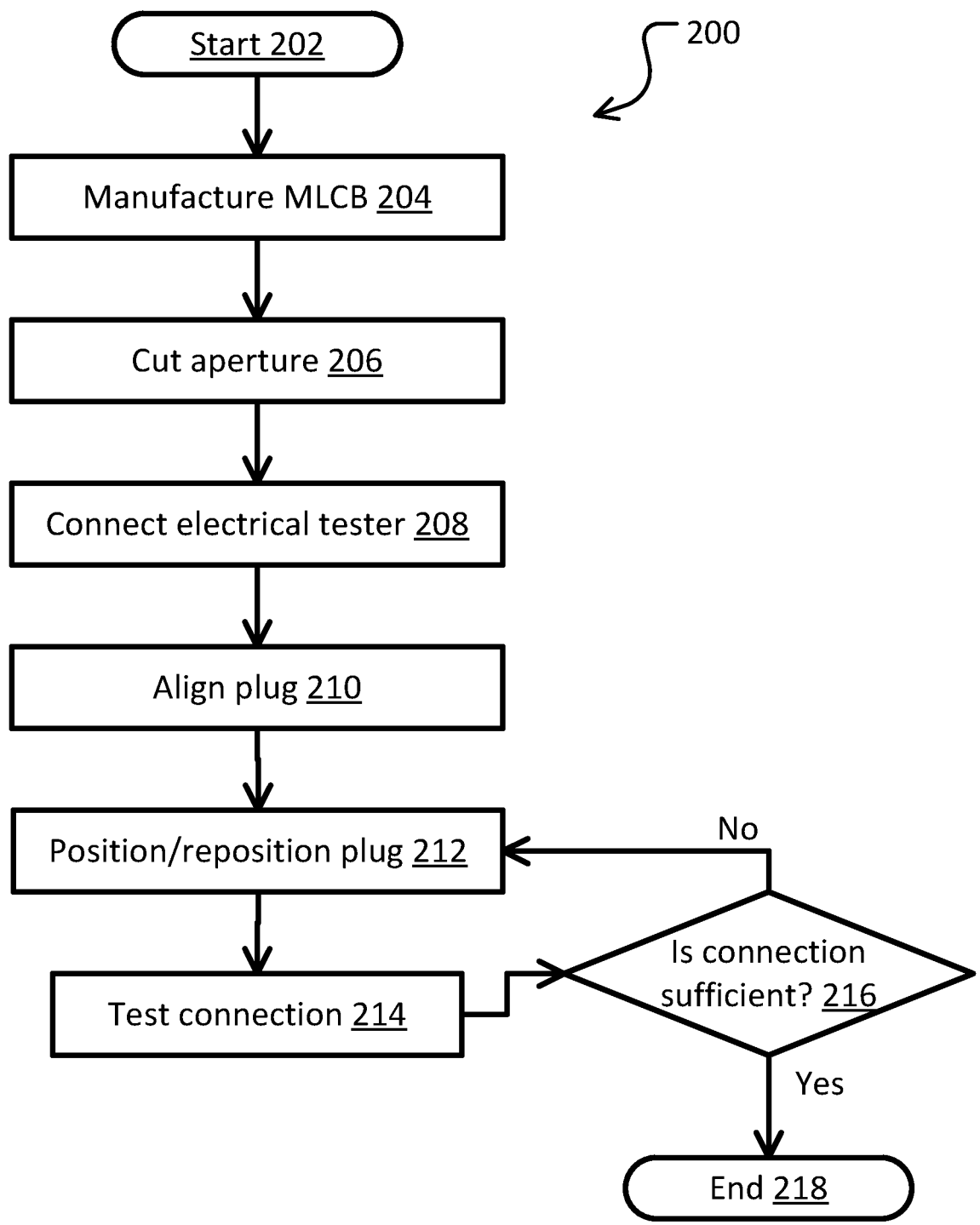
FIG. 4 is a flowchart of a method of assembling and testing the multi-layer circuit board, according to an embodiment of the present disclosure.

FIG. 4 is a flowchart of method 200 of assembling and testing MLCB 100, according to an embodiment of the present disclosure. In the description of FIG. 4, references may be made to components shown in FIGS. 1-3C and described therewith.

In the illustrated embodiment, method 200 starts at block 202. At block 204, MLCB 100 has its layers 104 formed (including traces 106) and its cores 102 and sheets 108 stacked and bonded. At block 206, an aperture is cut (e.g., drilled) through at least part of two layers 104 of MLCB 100. In some embodiments, the drilled aperture is not plated. At block 208, electrical testing device 122 is connected to traces 106-1 and 106-2. At block 210, plug 114 is aligned (i.e., rotated) with aperture 126, with indicator 120 being aligned with traces 106-1 and 106-2.

At block 212, plug 114 is positioned in aperture 126. At block 214, electrical testing device is activated to test the electrical connection between traces 106-1 and 106-2. At block 216, whether the electrical connection between traces 106-1 and 106-2 is sufficient is determined. If not, method 300 returns to block 212 so that plug 114 can be repositioned. In some embodiments, blocks 212, 214, and 216 can happen in real-time so that assembler 124 can know immediately when plug 114 is positioned properly. In such embodiments, an impedance value can be measured during positioning of plug 114, wherein the impedance value starts at a relatively high value. Once the impedance value transitions to a relatively low value (indicating a sufficient electrical connection between traces 106-1 and 106-2), insertion of plug 114 is halted. Once plug 114 is in the proper position, method 200 ends at block 218.

FIGS. 5A-7B show various alternate embodiments to the embodiment shown in FIGS. 1-3C. Where the features are similar across the Figures, the second and third digits of the reference numeral may be the same. In addition, the features of these alternate embodiments may be combined with each other and/or with the embodiment shown in FIGS. 1-3C where appropriate.

FIG. 5A is a schematic top view of alternate embodiment traces 306, bridge trace 318, and plug 314. In FIG. 5A, both traces 306 and the entirety of bridge trace 318 are shown as though they all exist in the same plane. Traces 306-1 and 306-2 would exist in different, parallel planes and bridge trace 318 would extend between them, but FIG. 5A appears as it does for the sake of simplicity.

In the illustrated embodiment, ends 328-1 and 328-2 (collectively, "ends 328") of traces 306-1 and 306-2, respectively, fan out, for example, horizontally (as shown), vertically (not shown), or conically (which would also appear as shown). Ends 328 increase the contact area for traces 306, which allows for an imprecise positioning of traces 306 and/or plug 314 to still make a sufficient electrical connection between traces 306-1 and 306-2. In addition, body 316 and the aperture (not shown) have corresponding tombstone-shapes. This prevents plug 314 from being inserted backwards since it can only be inserted into the aperture in a single orientation.

FIG. 5B is a schematic top view of alternate embodiment bridge trace 418. In FIG. 5B, the entirety of bridge trace 418 is shown as though it extends perpendicular to the axis (not shown) of plug 414, although this is done for the sake of simplicity.

In the illustrated embodiment, pads 430-1 and 430-2 (collectively, pads "430") are spherical in shape and are comprised of an electrically conductive elastomeric material. Pads 430 are connected to body 416 and are electrically connected to bridge trace 418. Since pads 430 can elastically deform relatively easily, body 416 can be undersized compared to aperture 126 (shown in FIG. 3A), but pads 430 can have an interference fit with aperture 126. Thereby, pads 430 will press against traces 106 (shown in FIG. 2) to form an electrical connection between traces 106-1 and 106-2. The pressure from pads 430 can also help plug 414 stay in place in aperture 126. In alternate embodiments, bridge trace 418 is also comprised of an electrically conductive elastomeric material, so pads 430 can be integral to bridge trace 418.

FIG. 6A is a perspective view of an alternate embodiment plug 514 with bridge trace 518 and ground traces 532-1 and 532-2 (collectively, "ground traces 532"), according to an embodiment of the present disclosure. In the illustrated embodiment, bridge trace 518 is inlayed into the exterior of body 516 and wraps around from one side to the other as opposed to going through body 516. In addition, ground traces 532 are inlayed into the exterior of body 516 and wrap around from one side to the other. Ground traces 532 are configured to connect to ground planes 112 (shown in FIG. 2), respectively. The presence of ground traces 532 can provide continuity to return currents and eliminates the need for separate pins 110 (shown in FIG. 2) for return paths. Additionally, the spacing of ground traces 532 and bridge trace 518 can be adjusted to tune the characteristic impedance of the signal transition.

FIG. 6B is a cross-sectional view (from a perspective similar to that of FIG. 2) of an alternate embodiment plug 614 with traces 606-1 to 606-4 and bridge traces 618-1 and 618-2. In the illustrated embodiment, plug 614 includes two unrelated electrical paths with the first being trace 606-1 to bridge trace 618-1 to trace 606-2, and the second being trace 606-3 to bridge trace 618-2 to trace 606-4. In addition, body 616 includes threading 634 which interfaces with threaded nut 636. Thereby, plug 614 can be securely held in place. In alternate embodiments, body 616 can be threaded along its entire length so that it can be screwed into an entirely threaded aperture (not shown).

FIG. 7A is a cross-sectional view (from a perspective similar to that of FIG. 2) of an alternate embodiment plug 714 with traces 106-1 and 106-2 and bridge trace 718. In the illustrated embodiment, bridge trace 718 is electrically connected to pad 738-1 and 738-2 (collectively, "pads 738"). Pads 738-1 and 738-2 reside in reliefs 740-1 and 740-2, respectively, in body 716. Pad 738-1 includes contact portion 742-1 and flexible portion 744-1, and, similarly, pad 738-2 includes contact portion 742-2 and flexible portion 744-2. Contact portions 742-1 and 742-2 are configured to contact traces 106-1 and 106-2, respectively, and flexible portions 744-1 and 744-2 allow contact portions 742-1 and 742-2 to move outward when urged by biasing members 746-1 and 746-2 (e.g., springs), respectively. Thereby, pads 738 will press against traces 106, respectively, to form an electrical connection between traces 106-1 and 106-2. The pressure from pads 738 can also help plug 714 stay in place in aperture 126. In alternate embodiments, the outward force is provided by flexible portions 744-1 and 744-2, so biasing members 746-1 and 746-2 may be absent.

FIG. 7B is a cross-sectional view (from a perspective similar to that of FIG. 2) of an alternate embodiment plug 814 with traces 106-1 and 106-2 and bridge trace 818. In the illustrated embodiment, body 816 includes interstice 848 that splits body 816 into two fingers 850-1 and 850-2 (collectively, fingers 850). Fingers 850 are deflectable outward by screwing spreader 852 into threading 854 of plug 814. Thereby, the ends of bridge trace 818 will be pressed against traces 106, respectively, to form an electrical connection between traces 106-1 and 106-2. The outward pressure from fingers 850 can also help plug 814 stay in place in aperture 126. In order to cope with the spreading of fingers 850, bridge trace 818 can include convolutions 856 so that bridge trace 818 can elongate. In alternate embodiments, bridge trace 818 can be straight and be stretched in place as spreader 852 is screwed in and fingers 850 spread apart.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A multi-layer circuit board comprising:
a first layer including a first trace;
a second layer connected to the first layer and including a second trace;
a stubless interconnect positioned through the first layer and the second layer, the stubless interconnect comprising:
a body that is electrically insulative and includes an interstice; and
a bridge trace that is electrically conductive and connected to the body, the bridge trace extending from the first trace to the second trace to electrically connect the first trace and the second trace; and
a spreader configured to widen the interstice to press the bridge trace against the first trace and the second trace.

2. The multi-layer circuit board of claim 1, wherein a cross-sectional area of the bridge trace is no more than twice a cross-sectional area of the first trace and/or a cross-sectional area of the second trace.

3. The multi-layer circuit board of claim 1, wherein the bridge trace extends through the body.

4. The multi-layer circuit board of claim 1, wherein the bridge trace extends around an exterior of the body.

5. The multi-layer circuit board of claim 1, further comprising:
an indicator on an end of the body that visually indicates the orientation of the stubless interconnect.

6. The multi-layer circuit board of claim 1, further comprising:
an electrical testing device connected to the first trace and to the second trace;
wherein the electrical testing device is configured to test the electrical connection between the first trace and the second trace via the bridge trace.

7. A method comprising:
providing a multi-layer circuit board comprising a first layer including a first trace and a second layer connected to the first layer and including a second trace;
cutting an aperture through the first layer and the second layer;
inserting a stubless interconnect into the aperture, the stubless interconnect comprising:
a body that is electrically insulative; and
a bridge trace that is electrically conductive and connected to the body, the bridge trace extending from the first trace to the second trace to electrically connect the first trace and the second trace;
connecting an electrical testing device to the first trace and to the second trace; and
testing an electrical connection of the first trace and the second trace via the bridge trace after inserting the stubless interconnect into the aperture, wherein the testing including measuring an impedance value between the first trace and the second trace during the insertion of the stubless interconnect, and the insertion of the stubless interconnect is halted after the impedance value has gone from a high value to a low value, representing that the electrical connection between the first trace and the second trace via the bridge trace is sufficient.

8. The method of claim 7, further comprising:
aligning an indicator on the body to electrically connect the bridge trace to the first trace and the second trace.

9. The method of claim 7, further comprising:
repositioning the stubless interconnect in response to the testing determining that the electrical connection is insufficient.

10. The method of claim 7, wherein the testing the electrical connection comprises:
measuring a signal quality through the first trace, the bridge trace, and the second trace using a time-domain reflectometer.

11. A stubless interconnect for a multi-layer circuit board comprising:
a body that is electrically insulative and is configured to pass through a first layer and a second layer of the multi-layer circuit board;
a bridge trace that is electrically conductive and connected to the body, wherein when the stubless interconnect is installed in the multi-layer circuit board, the bridge trace extends from the first layer to the second layer to electrically connect to a first trace in the first layer and a second trace in the second layer;
a bridge indicator on an end of the body that visually indicates a rotational orientation of the stubless interconnect; and
a trace indicator on an exterior side of the multi-layer circuit board that visually indicates lateral orientations of traces that are to be connected by the bridge trace;
wherein a cross-sectional area of the bridge trace is no more than thrice a cross-sectional area of the first trace and/or a cross-sectional area of the second trace.

12. The stubless interconnect of claim 11, wherein the bridge trace extends through the body.

13. The stubless interconnect of claim 11, wherein the bridge trace extends around an exterior of the body.

14. The stubless interconnect of claim 11, wherein the body includes an interstice, the stubless interconnect further comprising:
a spreader configured to widen the interstice to press the bridge trace against the first trace and the second trace.

15. The stubless interconnect of claim 11, wherein the cross-sectional area of the bridge trace is between half and one-and-a-half of the cross-sectional area of the first trace and/or the cross-sectional area of the second trace.

* * * * *